United States Patent
Capanu et al.

(10) Patent No.: US 8,693,162 B2
(45) Date of Patent: Apr. 8, 2014

(54) ELECTROSTRICTIVE RESONANCE SUPPRESSION FOR TUNABLE CAPACITORS

(75) Inventors: Mircea Capanu, St. Catharines (CA); Andrew Cervin-Lawry, Oakville (CA); Marina Zelner, Burlington (CA)

(73) Assignee: BlackBerry Limited, Waterloo, Ontario (CA)

( * ) Notice: Subject to any disclaimer, the term of this patent is extended or adjusted under 35 U.S.C. 154(b) by 141 days.

(21) Appl. No.: 13/467,641

(22) Filed: May 9, 2012

(65) Prior Publication Data

US 2012/0218733 A1    Aug. 30, 2012

Related U.S. Application Data

(63) Continuation of application No. 12/407,802, filed on Mar. 20, 2009, now Pat. No. 8,194,387.

(51) Int. Cl.
*H01G 5/00*    (2006.01)
*H01G 7/00*    (2006.01)

(52) U.S. Cl.
USPC .............. 361/277; 361/301.1; 361/301.4; 361/306.1; 361/306.3; 361/311; 361/312; 361/328; 361/330

(58) Field of Classification Search
None
See application file for complete search history.

(56) References Cited

U.S. PATENT DOCUMENTS

| | | |
|---|---|---|
| 4,240,003 A | 12/1980 | Larson |
| 4,307,356 A | 12/1981 | Arai |
| 4,491,697 A | 1/1985 | Tanaka |
| 5,640,042 A | 6/1997 | Koscica |
| 5,745,335 A | 4/1998 | Watt |
| 5,825,117 A | 10/1998 | Ossmann |
| 6,121,649 A | 9/2000 | Kunishima |
| 6,362,500 B2 | 3/2002 | Ishiwara |
| 6,377,142 B1 | 4/2002 | Chiu |
| 6,377,217 B1 | 4/2002 | Zhu |
| 6,377,440 B1 | 4/2002 | Zhu |
| 6,404,614 B1 | 6/2002 | Zhu |
| 6,437,484 B1 | 8/2002 | Nishimura |
| 6,492,883 B2 | 12/2002 | Liang |

(Continued)

FOREIGN PATENT DOCUMENTS

| | | |
|---|---|---|
| EP | 1408537 | 4/2004 |
| WO | 2007/047384 | 4/2007 |

OTHER PUBLICATIONS

Patent Cooperation Treaty, "International Search Report dated Oct. 6, 200S for PCT application serial No. PCT/US200S/004919".

(Continued)

*Primary Examiner* — Jayprakash N Gandhi
*Assistant Examiner* — Dion Ferguson
(74) *Attorney, Agent, or Firm* — Guntin & Gust, PLC; Andrew Gust

(57) ABSTRACT

A multi-layered capacitor includes three or more capacitor layers. A first layer includes a first DC-biased, tunable capacitor. A second layer, acoustically coupled to the first layer, includes a second DC-biased, tunable capacitor. A third layer, acoustically coupled to the second layer, includes a third DC-biased, tunable capacitor. Each dielectric of the first, second, and third capacitors has a resonance of about the same frequency, within 5%, and inner electrodes of the first, second, and third capacitors have a resonance of about the same frequency, within 5%. The resonance of each layer is a function of at least thickness, density, and material. The first, second, and third layers are biased to generate destructive acoustic interference, and the multi-layer capacitor is operable at frequencies greater than 0.1 GHz.

20 Claims, 5 Drawing Sheets

(56) References Cited

U.S. PATENT DOCUMENTS

| | | |
|---|---|---|
| 6,514,895 B1 | 2/2003 | Chiu |
| 6,525,630 B1 | 2/2003 | Zhu |
| 6,531,936 B1 | 3/2003 | Chiu |
| 6,556,102 B1 | 4/2003 | Sengupta |
| 6,597,265 B2 | 7/2003 | Liang |
| 6,603,367 B2 | 8/2003 | Pao |
| 6,617,062 B2 | 9/2003 | Chang |
| 6,621,377 B2 | 9/2003 | Osadchy |
| 6,646,522 B1 | 11/2003 | Kozyrev |
| 6,653,912 B2 | 11/2003 | Robinson |
| 6,674,321 B1 | 1/2004 | York |
| 6,683,513 B2 | 1/2004 | Shamsaifar |
| 6,683,516 B2 | 1/2004 | Chiu |
| 6,683,517 B2 | 1/2004 | Chiu |
| 6,686,814 B2 | 2/2004 | Chiu |
| 6,686,817 B2 | 2/2004 | Zhu |
| 6,710,679 B2 | 3/2004 | Zhu |
| 6,717,491 B2 | 4/2004 | Liang |
| 6,724,280 B2 | 4/2004 | Shamsaifar |
| 6,727,535 B1 | 4/2004 | Sengupta |
| 6,737,179 B2 | 5/2004 | Sengupta |
| 6,774,077 B2 | 8/2004 | Sengupta |
| 6,794,262 B2 | 9/2004 | Ning |
| 6,794,960 B2 | 9/2004 | Chiu |
| 6,801,102 B2 | 10/2004 | Shamsaifar |
| 6,801,104 B2 | 10/2004 | Zhu |
| 6,860,954 B2 | 3/2005 | Mamada |
| 6,864,840 B2 | 3/2005 | Zhu |
| 6,864,843 B2 | 3/2005 | du Toit |
| 6,876,279 B2 | 4/2005 | Sengupta |
| 6,903,633 B2 | 6/2005 | Zhu |
| 6,905,989 B2 | 6/2005 | Ellis |
| 6,949,982 B2 | 9/2005 | du Toit |
| 6,954,118 B2 | 10/2005 | Kozyrev |
| 6,960,546 B2 | 11/2005 | Caspers |
| 6,967,540 B2 | 11/2005 | du Toit |
| 6,987,493 B2 | 1/2006 | Chen |
| 7,034,636 B2 | 4/2006 | Shamsaifar |
| 7,042,316 B2 | 5/2006 | Shamsaifar |
| 7,056,468 B2 | 6/2006 | Chiu |
| 7,109,818 B2 | 9/2006 | Rivkina |
| 7,224,040 B2 | 5/2007 | Koutsaroff |
| 7,936,553 B2 | 5/2011 | Oakes |
| 2001/0015619 A1 | 8/2001 | Nagano |
| 2005/0068219 A1 | 3/2005 | Kobayashi |
| 2006/0274476 A1 | 12/2006 | Cervin-Lawry |
| 2006/0282999 A1 | 12/2006 | Majumdar |
| 2007/0007853 A1 | 1/2007 | Toit |
| 2007/0007854 A1 | 1/2007 | Oakes |
| 2008/0232023 A1 | 9/2008 | Oakes |
| 2009/0040687 A1 | 2/2009 | Oakes |
| 2011/0110016 A1 | 5/2011 | Takeshima |

OTHER PUBLICATIONS

Patent Cooperation Treaty, "International Search Report dated Aug. 27, 2008 for PCT application serial No. PCT/US200S/004935".

ELECTROSTRICTIVE RESONANCE SUPPRESSION FOR TUNABLE CAPACITORS

CROSS-REFERENCE TO RELATED APPLICATIONS

This application is a continuation of U.S. patent application Ser. No. 12/407,802 filed Mar. 20, 2009 which is incorporated herein by reference in its entirety.

FIELD OF THE DISCLOSURE

The technology described in this patent document relates generally to the field of tunable capacitors.

BACKGROUND OF THE DISCLOSURE

Thin-film circuit modules are commonly used in space-constrained applications, such as hearing instrument or cell phone products. In some thin-film circuit modules, perovskite or pyrochlore materials, such as $(Ba_{1-x}Sr_x)TiO_3$ (hereinafter BST), are used as high K capacitor dielectrics. The high dielectric constant (high-K) of these materials allows for significant miniaturization of these devices. Many capacitors can also be fabricated on a single substrate along with other passive electronic components (integrated passive component chips) to form part of electronic devices such as cell phone power amplifier modules, GPS receivers, etc.

These high-K dielectrics, such as BST, are also tunable, i.e. the dielectric constant of the is varied by changing the applied electric field. Tunable capacitors rely on the variable dielectric properties of the high-K dielectric. The capacitance at zero bias is a maximum and the capacitance drops with applied voltage. The change in capacitance allows these units to be used to create tunable circuits in filters, matching networks, resonant circuits and other applications from audio to RF and microwave frequencies. The dielectric constant of the tunable dielectric material determines the capacitance as $C = \in A/d$, where $\in$ is the dielectric constant of the tunable material, A is the area of the electrodes and d is the separation of the electrodes and thickness of the tunable material. A DC voltage is applied to the electrodes to induce an electric field in the tunable dielectric. The $\in$ of the tunable dielectric material is a function of the electric field, $E=V/d$, and thus the capacitance is a function of voltage.

Ferroelectric materials are also electrostrictive. As an electric field is applied, which lowers the dielectric constant, the piezoelectric constant of the material becomes non-zero. As a result, the electric field causes a physical change of the lattice constants of the film. Application of an AC signal to the piezoelectric material causes acoustic vibrations of atoms in the crystalline lattice, which is called electromechanical coupling. Therefore, any AC signal on the tunable capacitor under bias produces an acoustic response. At certain frequencies, the acoustic response of the structure will be resonant and some of the AC signal power will be converted into acoustic vibrations causing a loss of signal amplitude. The effect is seen as a narrow band of frequencies where the Q-factor of the capacitor is very low.

It has been shown that acoustic resonance can be at least partially cancelled by a multilayer capacitor that has two capacitors, one with a positive DC bias and one with a negative DC bias. It was previously thought that the number of layers of positively DC-biased dielectrics had to be equal to the number of negatively DC-biased dielectrics in order to observe the acoustic resonance cancellation effect. This was based on the theory that acoustic vibrations from the positively biased capacitors would interfere with the opposite phase acoustic vibrations of the negatively biased capacitors. These earlier efforts are fairly limited in operable frequency range. For instance, FIG. 1 shows a simulated Q factor vs. frequency within the operable frequency range for a two-layer capacitor (solid line) 1.

SUMMARY

A multi-layered capacitor includes three or more capacitor layers. A first layer includes a first DC-biased, tunable capacitor. A second layer, acoustically coupled to the first layer, includes a second DC-biased, tunable capacitor. A third layer, acoustically coupled to the second layer, includes a third DC-biased, tunable capacitor. Each dielectric of the first, second, and third capacitors has a resonance of about the same frequency, within 5%, and inner electrodes of the first, second, and third capacitors have a resonance of about the same frequency, within 5%. The resonance of each layer is a function of at least thickness, density, and material. The first, second, and third layers are biased to generate destructive acoustic interference, and the multi-layer capacitor is operable at frequencies greater than 0.1 GHz.

A multi-layered capacitor includes three or more capacitor layers. A first layer includes a first DC-biased capacitor. A second layer, acoustically coupled to the first layer, includes a second DC-biased capacitor. A third layer, acoustically coupled to the second layer, includes a third DC-biased, capacitor. The capacitor is operable at frequencies of 0.1 to 40 GHz. A total number of positive DC-biased dielectric layers is not equal to a total number of negative DC-biased dielectric layers.

A method includes reducing the losses due to resonance and improving Q factor in an odd number layered capacitor having at least three layers, by acoustically coupling the layers of the capacitor and providing a DC bias to each dielectric of the capacitor, biasing each dielectric such that the acoustic vibration of the layers destructively interfere with each other. The capacitor is operable at frequencies of 0.1 GHz to 40 GHz.

The term "acoustically coupled" means that components are physically in contact or that the components are in such close physical proximity that an acoustic vibration in the first component causes acoustic vibration in the other. The first, second, and third layers can be located anywhere in a multi-layer stack and the multi-layer stack may also contain other capacitor layers.

DETAILED DESCRIPTION OF THE DRAWINGS

Described herein are example structures for an acoustic-resonance-reducing, three or more layer capacitor. By resonantly coupling capacitor layers that resonate at about the same frequency, such as within 5% or 1%, and biasing the dielectric of each layer in a certain way, the acoustic resonance of the capacitor is substantially reduced. Reducing or eliminating the acoustic resonance provides an improved Q factor and prevents some gaps in the operable frequency range of the capacitor. The three or more layer capacitor may be constructed to be operable at high Q-factors for a number of wide frequency bands, such as those exceeding 1.8 GHz or 3 GHz.

Figure 1:
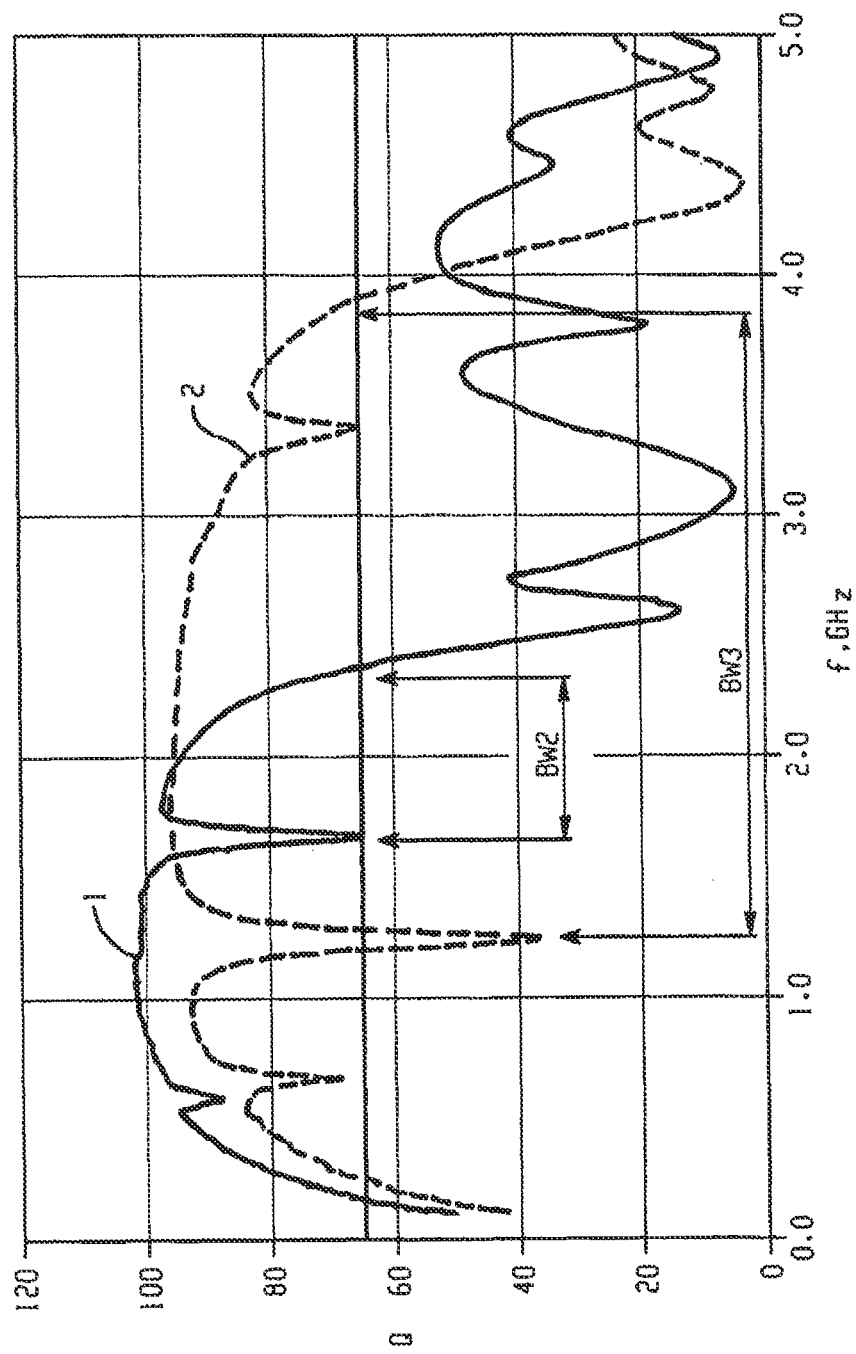
FIG. 1 is a graph showing a simulated comparison of two-layer and three-layer alternately DC-biased multi-layer tunable capacitors.
Figure 2:
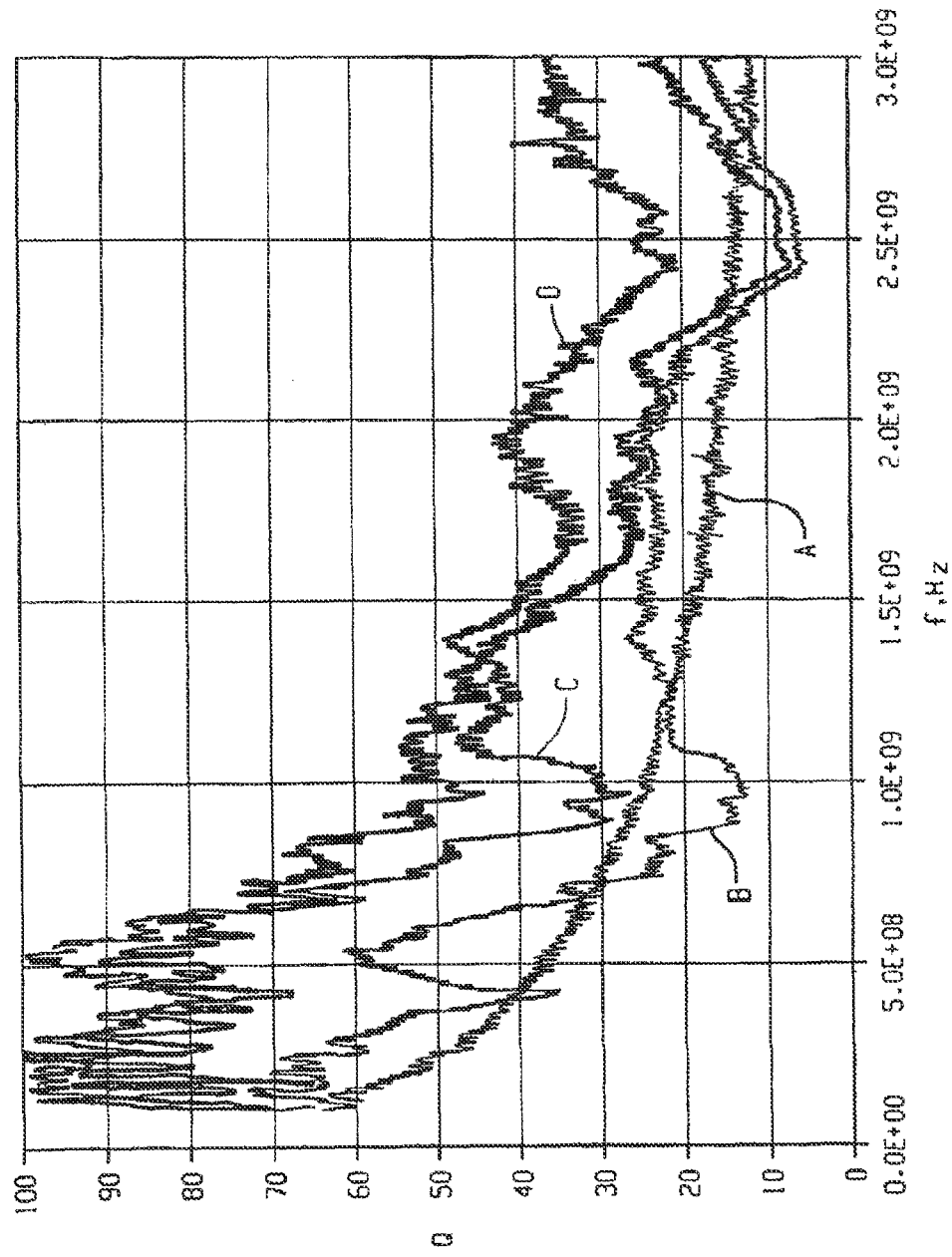
FIG. 2 is a graph showing a comparison of the measured Q-factors of several different capacitors.
Figure 3:
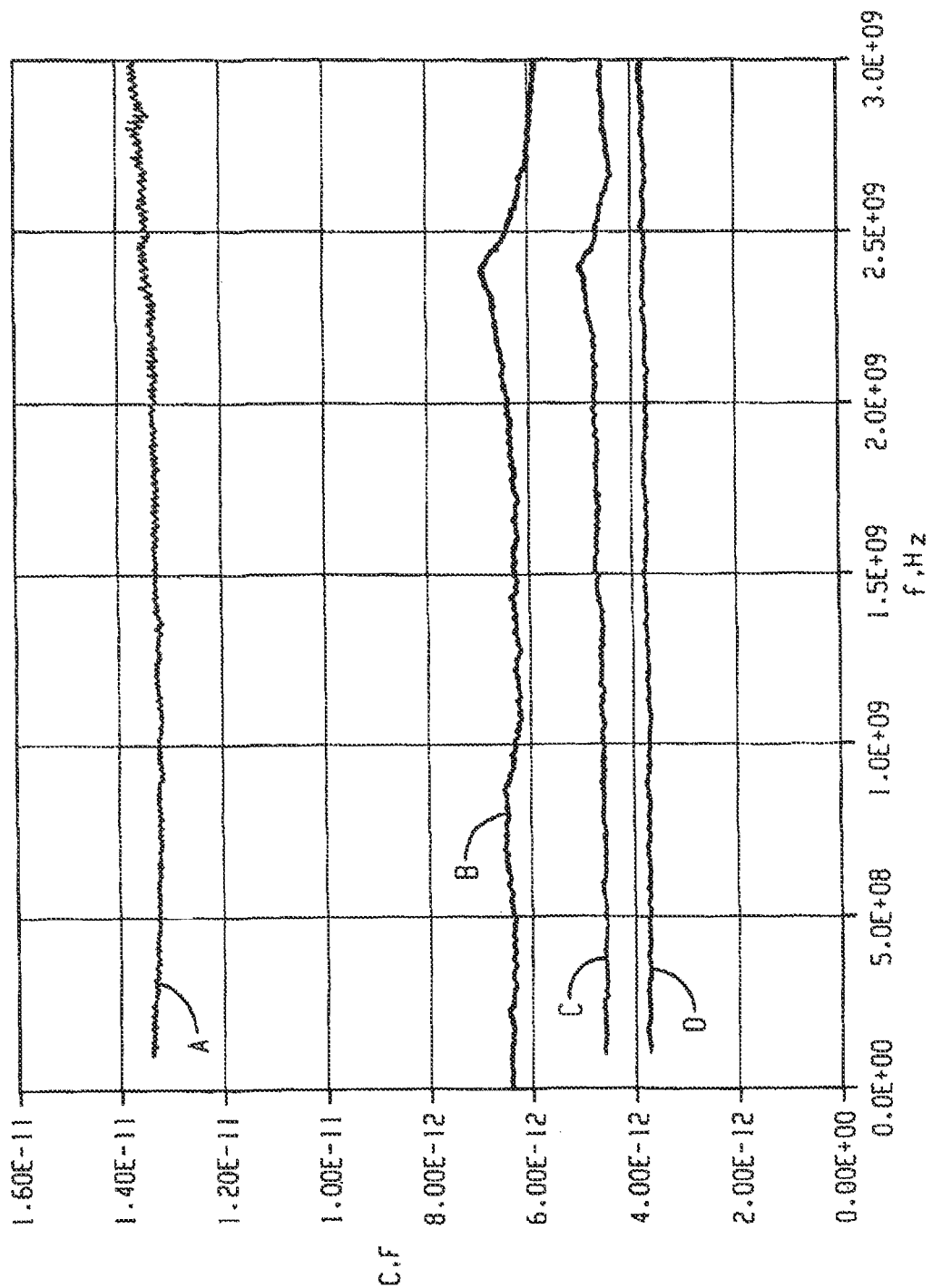
FIG. 3 is a graph showing a comparison of the capacitance of several different capacitors.

FIG. 1 illustrates a simulated Q factor vs. frequency graph of the operable frequency range of an example three-layer capacitor (broken line) 2. FIGS. 2-3 illustrate actual tests comparing four different capacitors. This data illustrates how the three-layer capacitor compares favorably to the prior art.

FIG. 2 is a graph showing the measured Q-factor of several different capacitors over a frequency range of 0 to 3.0 GHz. Line A shows the performance of an unbiased three-layer, tunable capacitor with high-K tunable dielectric. Line B shows the performance of a biased one-layer, tunable, high-K BST capacitor. Line C shows the performance of a two-layer, biased, tunable, BST capacitor. Finally, line D shows the performance of a biased, three-layer, tunable BST capacitor with high-K tunable dielectric. All capacitors represented on the graph were constructed of the same materials, and tested under the same conditions, but with different bias conditions.

It is evident from FIG. 2 that the three-layer tunable capacitor with high-K tunable 10 dielectric (line D) has a Q-factor of 20 or higher through the entire frequency range. In contrast, none of the other capacitors stay above a Q factor of 20 through the entire range. Without being bound to theory, it is believed that this is caused by the improved acoustic resonance suppression in the three-layer tunable capacitor with high-K tunable dielectric. The two-layer capacitor (line C) with tunable high-K dielectric appears to display some beneficial acoustic suppression below about 1.8 GHz, however, it behaves substantially the same as the one-layer capacitor with high-K tunable dielectric at frequencies higher than 1.8 GHz.

FIG. 3 illustrates the capacitance vs. frequency characteristics of the same for different types of capacitors that were shown in FIG. 2. The non-biased capacitor (Line A) has approximately linear capacitance in the given frequency range. The biased, tunable one-layer capacitor with high-K tunable dielectric (Line B) has the highest non-linearity, while the biased, two-layer capacitor with high-K tunable dielectric (Line C) has the next highest non-linearity. Electrostrictive resonance is believed to be a root cause of that nonlinearity. In contrast, the biased three-layer capacitor with high-K tunable dielectric (Line D) is clearly more linear than either the two-layer or one-layer stack. In fact, it is practically linear, similar to the non-biased capacitor (Line A). This data indicates an improved acoustic suppression in the three-layer capacitor over the one- and two-layer biased capacitors and the three-layer ability to preserve the unbiased Q value.

As mentioned above, previous efforts had shown that the number of dielectrics biased positively had to be equal to the number of dielectrics biased negatively to produce an acoustic cancelling effect. Thus, it was quite unexpected that a three or more layer capacitor having an odd number of alternately biased dielectrics produced improved results compared to the two-layer capacitor. These results suggest that the acoustic cancellation mechanism in multi-layer capacitors with alternating bias is more complex and unpredictable than simple wave cancelling in pairs.

The example structures and methods described herein allow for a variety of process options to be used with the dielectric layer and facilitate optimizing of the dielectric layer. The subject of this disclosure also allows further processing of the structure to integrate other passive components such as inductors, resistors, and capacitors with other dielectric materials. The circuit structures described herein, may, for example, be used in a system-on-a-package (SoP) structure for electronic devices requiring high volumetric density for capacitors and other integrated passives (e.g., inductors, resistors) in radio frequency (RF), Bluetooth, and high-speed wireless (e.g., wideband) communication modules, such as components for cellular phones. Particularly when optimized for high frequency operation, the capacitors described herein may be used in electronic devices such as satellite communications equipment.

Figure 4:
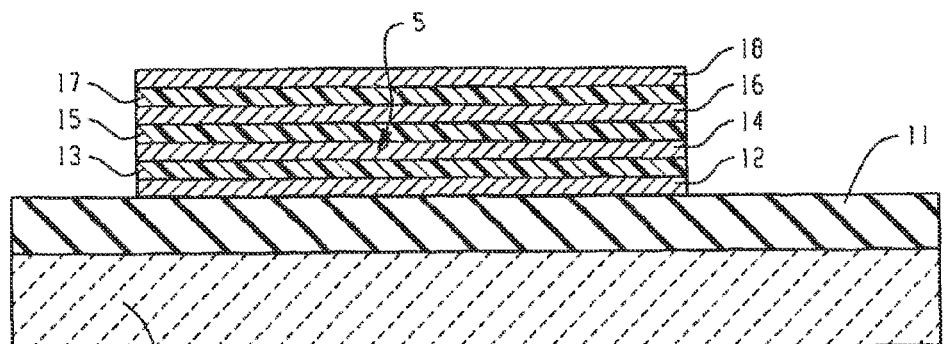
FIG. 4 is a cross-sectional view of an example three-layer tunable capacitor.
Figure 5:
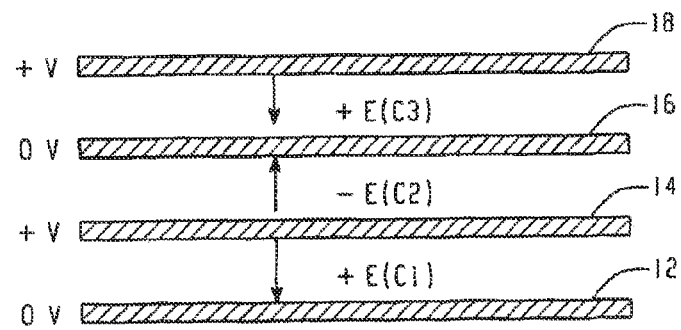
FIG. 5 is a diagram of an example biasing scheme for the example three-layer tunable capacitor.

FIG. 4 is a diagram of an example three-layer capacitor 5 fabricated on a substrate 10. Also illustrated in FIG. 1 is an optional insulating and/or planarizing layer 11 that is fabricated between the substrate 10 and the three-layer capacitor 5.

The example three-layer capacitor 5 includes three capacitors that are acoustically coupled by being stacked in physical contact one on top of the other. The top and bottom capacitors each share an electrode with the middle capacitor. In this example structure the capacitors are in stacked physical contact; however, the capacitors being adjacent or in such close physical proximity as to cause an acoustic vibration in one or more of the other capacitors are examples of other configurations of the capacitor structure.

In the example three-layer capacitor 5, a first electrode 12 is disposed on the optional insulating and/or planarizing layer 11. A first dielectric 13 is disposed on top of the first electrode 12, and a second electrode 14 is disposed on top of the first dielectric 13. The first electrode 12, first dielectric 13, and second electrode 14 form the first capacitor layer.

The second capacitor layer is formed by the second electrode 14 and a third electrode 16, 15 with a second dielectric 15, sandwiched between them. The second capacitor layer shares the second electrode 14 with the first capacitor layer.

Similarly, the third capacitor layer is formed by the third electrode 16 and a fourth electrode 18, with a third dielectric 17, sandwiched between them. The third capacitor layer shares the third electrode 16 with the second capacitor layer.

In the example three-layer capacitor 5, the capacitor layers are biased as shown in FIG. 3. The first electrode 12 is grounded, the second electrode 14 has a positive voltage, the third electrode 16 is grounded, and the fourth electrode 18 has a positive voltage. This results in a bias scheme of positive for the first capacitor, negative for the second capacitor, and positive for the third capacitor. In another example, the bias scheme may be the opposite, i.e. negative for the first capacitor, positive for the second capacitor, and negative for the third capacitor. The bias scheme in both such examples is referred to as biased successively and alternately positive and negative. In the example three-layer capacitor 5, a positive DC voltage may be applied to both the second and fourth electrodes 14, 18. In other examples the DC voltage can be negative. In this example the positive DC voltage is the same magnitude on each of the second and fourth electrodes 14, 18, but differing voltages may be utilized in other examples.

Upon application of an RF signal to the capacitor 5, and the addition of DC bias, the three dielectrics 13, 15, 17 are caused to acoustically vibrate in time to the RF signal. The inner electrodes, i.e. the second and third electrodes 14, 16 will vibrate while the first and fourth electrodes 12, 18 are relatively still. This vibration will be dependent on the density and thickness and composition of the materials in the stack. This means that the capacitor layers are not transmitting first-order acoustic energy to the first and fourth electrodes 12, 18 of the capacitor 5. Accordingly, the capacitor 5 is not transmitting acoustic energy into the surrounding layers causing extra losses. There may be vibrations within the dielectric layers 13, 15, 17 and this will cause some negligible loss.

FIG. 4 depicts another embodiment, an example five-layer capacitor 105. The example five-layer capacitor 105 includes five capacitors that are acoustically coupled by being contiguously stacked in physical contact one on top of the other. In this example capacitor structure the capacitors are in stacked physical contact; however, the capacitors being adjacent or in such close physical proximity as to cause an acoustic vibration in one or more of the other capacitors are examples of other configurations of the capacitor structure.

In the example five-layer capacitor 105, a first electrode 112 is disposed on the optional insulating and/or planarizing layer Ill. A first dielectric layer 113 is disposed on top of the first electrode 112, and a second electrode 114 is disposed on top of the first dielectric layer 113. The first electrode 112, first dielectric layer 113, and second electrode 14 form the first capacitor layer.

The second capacitor layer is formed by the second electrode 114 and a third electrode 116, with a second dielectric layer 115, sandwiched between them. The second capacitor layer shares the second electrode 114 with the first capacitor layer.

The third capacitor layer is formed by the third electrode 116 and a fourth electrode 118, with a third dielectric layer 117, sandwiched between them. The third capacitor layer shares the third electrode 116 with the second capacitor layer.

The fourth capacitor layer is formed by the fourth electrode 118 and a fifth electrode 120, with a fourth dielectric layer 119, sandwiched between them. The fourth capacitor layer shares the fourth electrode 118 with the third capacitor layer.

Figure 6:
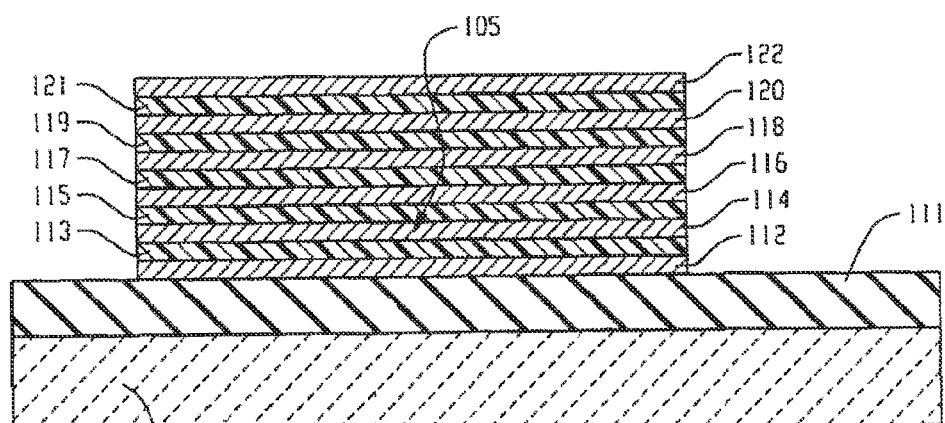
FIGS. 6 and 6b are a cross-sectional view of an example five-layer tunable capacitor.
Figure 6B:
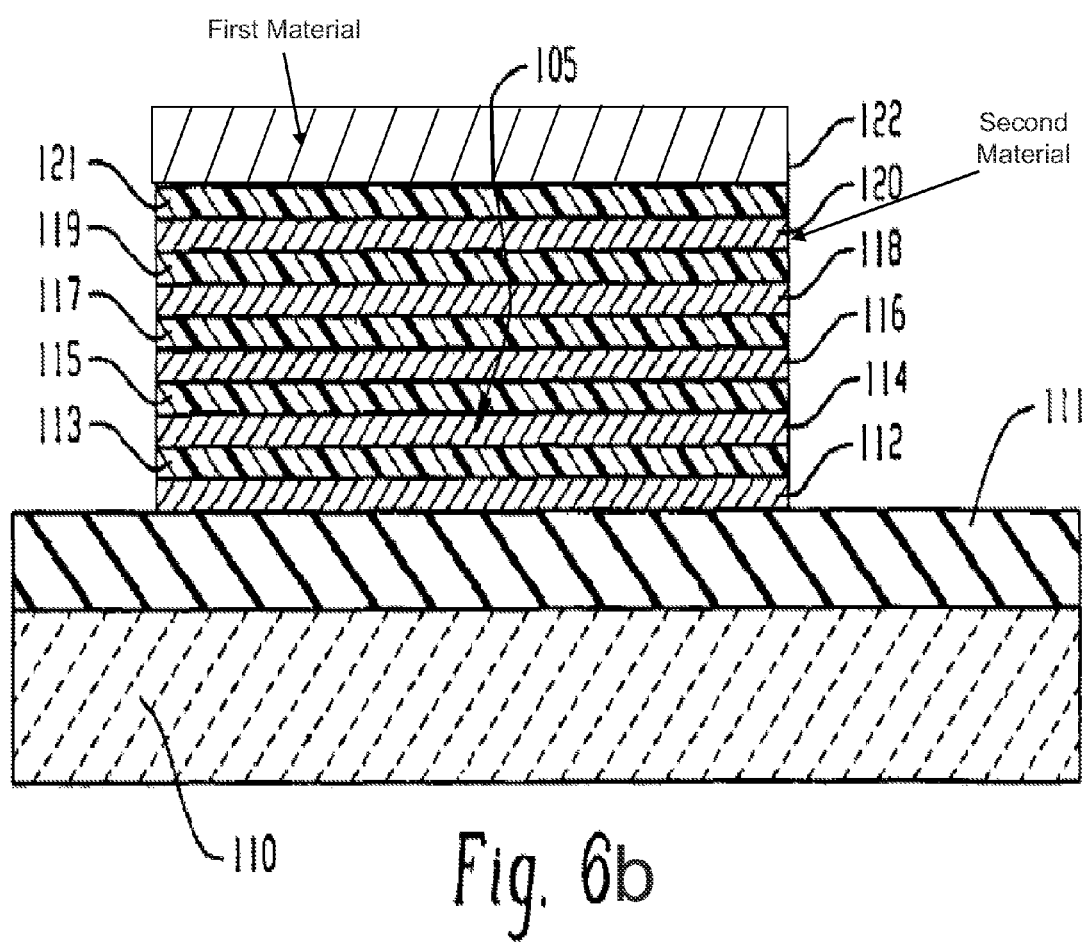

Finally, the fifth capacitor layer is formed by the fifth electrode 120 and a sixth electrode 122, with a fifth dielectric layer 121, sandwiched between them. The fifth capacitor layer shares the fifth electrode 120 with the fourth capacitor layer. The thickness, density, and/or material type is varied between layer 122 and layer 120 in the embodiment of FIG. 6b.

The inner electrodes of the example five-layer capacitor 105 are the second, third, and fourth electrodes 114, 116, 118.

Each dielectric of the example capacitors described above is approximately the same thickness, such as within 20% or within 10% and density such as within 3% or 1%. The inner electrodes are also approximately the same thickness, such as within 20% or within 10% and density such as within 3% or 1%. For example, the dielectric layers may each be 100 nm to 500 run thick, but within 10% deviation of each other. Furthermore, in the examples described above, each dielectric is made of the same type of material and each electrode is made of the same type of material. The dielectrics and electrodes are of the same or approximately the same size in the examples.

Without being bound by theory, this configuration is believed to cause each dielectric and electrode, respectively, to resonate at about the same frequency, thereby allowing each capacitor to interfere acoustically with another at the same or about the same frequency.

Other configurations may also be used wherein the thickness, density, and material type are varied among each layer, but are preferably controlled to resonate at the same or about the same frequency as the other layers.

The acoustic cancellation may not eliminate all acoustic loss as the dielectric layers and the inner electrode layers may still vibrate and generate losses; however the acoustic loss will be reduced at most frequencies and invisible in many cases. The three or more layer structure allows the electric resistivity of the inner layers to be relaxed and a wider range of materials may be used. Different materials and thicknesses used for the inner electrodes will change the operational frequency range and the extent of the intrinsic loss of the multi-layer structure, thereby allowing the device to be adapted for different frequency bands of operation.

The optimum frequency range of the three or more layer acoustic cancelling capacitor can be adjusted by changing the material type, thickness, and/or density. Other adjustments can also be made to modify the operable frequency range. Although it can be constructed to be operable from 0.1 GHz to 40 GHz, the three or more layer capacitor is capable of high frequency operations, for example 1.5 GHz to 40 GHz, such as 1.8 GHz to 40 GHz, 20 GHz to 40 GHz, 2 GHz to 12 GHz, or 3 GHz to 6 GHz, at Q factors equal or better than the value of the unbiased capacitor, including values of 20 or more or 40 or more. Relatively low frequencies are also possible and have a high Q factor for a wide frequency range. For example, a three or more layer capacitor as described herein may have a Q factor of 60 or greater from 0.7 to 2.3 GHz, or 1.5 GHz to 4.0 GHz. It can also be adjusted to have a Q factor of 40 or greater from 2.0 GHz to 12 GHz. It may also have a Q factor of 40 or greater in a range of 1.8 GHz to 3 GHz, or at a lower range of 0.1 GHz to 3.0 GHz.

Furthermore, in an embodiment of multi-layer capacitors described herein, the capacitance vs. frequency curve is substantially linear, such as with no ripples. For example, the capacitance is substantially linear within a frequency range of 0.1 to 3 GHz. The capacitance may also be substantially linear or practically linear from 0.1 to 40 GHz. Substantially linear means with less variation than line C on FIG. 3. Practically linear means as much or less variation in capacitance as line D on FIG. 3.

Each type of layer of the example capacitors are now discussed in more detail.

The substrate 10 may, for example, be Si, $Al_2O_3$, sapphire AlN, quartz, $MgTiO_3$, 15 $Mg_2SiO_4$, GaAs, GaN, SiC or some other insulating, semi-insulating, or semi-conducting material, either single-crystal, polycrystalline or mono-crystalline. Ceramic substrate materials are typically affordable and are highly machinable. A ceramic substrate 10 may therefore include fine-pitched metal filled through holes that provide low and controlled parasitics. In addition, a ceramic substrate material provides substantially better Q-factors for other passive components (e.g. thin-film inductors) than conventional silicon-based substrates.

A smooth surface sufficient to fabricate the example three-layer capacitor 5 is provided by the planarizing and/or insulating layer 11. In another example, the three-layer capacitor 5 may be fabricated directly on the substrate; however, the fabrication of a high value thin-film capacitor (e.g., with an overall capacitance density from 10 to 390 $fF//\mu m^2$) requires a high degree of precision, and this is difficult to achieve with some rough substrate materials such as ceramic. Therefore, the planarizing layer 11 allows for increased precision. It may also facilitate better adhesion of the capacitor 5 to the substrate 10.

The planarizing and/or insulating layer 11 may be a thick film dielectric material that is polished to provide a smooth upper surface. In another example, this layer 11 may be a smooth (fire polished) glass dielectric material. In the case of a polished thick film layer 11, the surface roughness (Ra) of the smooth upper surface may be less than or equal to 0.08 micrometers (μm), such as less than or equal to 0.06 μm. In the case of a glass dielectric smoothing and/or insulating layer 11, the surface roughness (Ra) of the smooth upper surface may be less than or equal to 0.08 μm, such as less than or equal to 0.03 μm. In addition to providing a low surface roughness (e.g., Ra≤0.08 μm), this layer 11 is substantially free of micro pores and is thus stable at high temperatures. For example, the smoothing and/or insulating layer 11 should be able to withstand multiple anneals at high temperatures (e.g., 600-800° C.) in an oxidizing ambient without substantially affecting its surface quality or the resistivity of any metal filled vias. As a result, the high-k ferroelectric layer(s) of the MLC 14 may be deposited using a simple spin-coat technology, as well as methods such as Physical Vapor Deposition (PVD) or Chemical Vapor Deposition (CVD).

The dielectric layers are formed, for example, from a high permittivity (High-K) dielectric perovskite or pyrochlore material of any stoichiometric or non-stoichiometric chemical composition. Preferably, the dielectric layers are highly tunable. Examples include compounds containing barium strontium titanium oxide or $(BaSr)TiO_3$ also known as BST, SBT, SBM, PZT or PLZT, and doped formulations of each. Other electrically tunable dielectric materials may be used partially or entirely in place of barium strontium titanium oxide. An example is strontium bismuth tantalate (SBT). Additional electronically tunable ferroelectrics include any electrically tunable compositions of high-K dielectrics, such as $NaNO_3$, $KNbO_3$, $BaTiO_3$, $SrTiO_3$, $CaTiO_3$, members of the lead titanate family such as $PbTiO_3$, $Pb(Zr_xTi_{1-x})O_3$ (PZT), $(Pb,Sr)(Zr_xTi_{1-x})O_3$, $(Pb,La)(Zr_xTi_{1-x})O_3$ (PLZT), niobate-tantalate family such as $LiTaO_3$, $PbNb_2O_6$, $KSr(NbO_3)$, $LiNbO_3$, $K(Ta_{1-x}Nb_x)O_3$, $PbTa_2O_6$ KDP ($KH_2PO_4$) layered perovskites/Aurivillius phases such as $SrBi_2Ta_2O_9$ (SBT), tungsten-bronze structures ($PbTa_2O_6$), phosphates such as $KH_2PO_4$ (KDP), fluorides such as $BaMgF_4$ including doped formulations, and mixtures or compositions thereof.

Additional minor additives in amounts of from about 0.1 to about 10 weight percent can be added to the composites to additionally improve the electronic properties of the films. These minor additives include oxides such as zirconates, tantalates, rare earths oxides, niobates and tantalates. For example, the minor additives may include $CaZrO_3$, $BaZrO_3$, $SrZrO_3$, $BaSnO_3$, $CaSnO_3$, $MgSnO_3$, $Bi_2O_3/2SnO_2$, $Nd_2O_3$, $Pr_7O_{11}$, $Yb_2O_3$, $HO_2O_3$, $La_2O_3$, $MgNb_2O_6$, $SrNb_2O_6$, $BaNb_2O_6$, $MgTa_2O_6$, $BaTa_2O_6$ and $Ta_2O_3$.

Films of tunable dielectric composites may comprise $Ba_{1-x}Sr_xTiO_3$ (BST) (or other tunable dielectric), in combination with at least one non-tunable dielectric phase including Group 2A elements in the form of oxide, silicate, zirconate, aluminate, tantalate, niobate or a mixture of thereof. Examples include MgO, $MgTiO_3$, $MgZrO_3$, $MgSrZrTiO_6$, $Mg_2SiO_4$, $MgAbO_4$, CaO, $CaSiO_3$, $CaTiO_3$, $BaSiO_3$ and $SrSiO_3$. The non-tunable dielectric phases may be any combination of the above, e.g., MgO combined with $MgTiO_3$, MgO combined with $MgSrZrTiO_6$, MgO combined with $Mg_2SiO_4$, MgO combined with $Mg_2SiO_4$, $Mg_2SiO_4$ combined with $CaTiO_3$. These compositions can be BST (or other tunable dielectric) and one of these components, or two or more of these components in quantities from 0.1 weight percent to 10 weight percent with BST (or other tunable dielectric) weight ratios of 99.9 weight percent to 90 weight percent.

In addition to Group 2A metals, the present metal oxides, silicates, zirconates, aluminates, tantalates, niobates or a combination thereof may include metals from Group 1A (alkali metals), i.e., Li, Na, K, Rb, Cs and Fr. For example, alkali metal silicates may include sodium silicates such as $Na_2SiO_3$ and $NaSiO_3-5H_2O$, and lithium-containing silicates such as $LiAlSiO_4$, $Li_2SiO_3$ and $Li_4SiO_4$.

Metals from Groups 3A, 4A and some transition metals of the Periodic Table may also be suitable constituents of the metal silicate phase. Additional oxides and silicates may include but not limited to $Al_2O_3$, $SiO_2$, ZrO2, $Al_2Si_2O_7$, $ZrSiO_4$, $KalSi_3O_8$, $NaAlSi_3O_8$, $CaAl_2Si_2O_8$, $CaMgSi_2O_6$, $BaTiSi_3O_9$ and $Zn_2SiO_4$.

Metals from other Groups of the Periodic Table may also be suitable constituents of the metal oxide phases. For example, oxides and/or other compounds of refractory metals such as Ti, V, Cr, Mn, Zr, Nb, Mo, Hf, Ta, and W may be used. Furthermore, metals such as Al, Si, Sn, Pb, and Bi may be used in the form of oxides and/or other compounds. In addition, the metal oxide phases may comprise rare earth elements such as La, Ce, Pr, Nd, Pm, Sm, Eu, Gd, Tb, Dy, Ho, Er, Tm, Yb, Lu in the form of oxides and/or other compounds solely or in composition with one or more of the above mentioned additives.

The electrode layers are formed, for example, from a conductive thin-film material (e.g., Pt, conductive oxides such as $SrRuO_3$, $LaNiO_3$, $LaMn_{1-x}Co_xO_3$, and other metals such as Ir, Au, Cu, and W). The electrode layers could be a single metal, or a multilayer structure comprised of two or more metals or combinations of metals with conductive oxides. These multilayer structures could include conductive barriers, such as but not limited to TixNy, TiW, TaxNy, Tax(ON)y, and antireflective layers.

The example three-layer capacitor 5 may be, but is not limited to, a mesa-structure formed using photolithography patterning. Via holes may be etched in the layers to allow access for a contact for each electrode. A three or more layer capacitor can be constructed with equipment and processes generally known in the art for producing thin-film capacitors. An example of an acceptable method of manufacture is disclosed in U.S. Pat. No. 5,745,335, which is hereby incorporated by reference.

Though the general equipment and process of manufacture is known, the parameters of the process should be controlled to provide a three-or-more layer capacitor that is biased to produce destructive acoustic interference in accordance with this disclosure. For example, a method of making a three or more layer capacitor includes reducing the losses due to resonance and improving Q factor in an odd number layered capacitor with at least three layers, by acoustically coupling the layers of the capacitor and providing a DC bias to each layer of the capacitor. The DC biasing is applied to each dielectric such that the acoustic vibrations of the layers destructively interfere with each other. Furthermore, the capacitor is operable at frequencies greater than 0.1 GHz. The capacitor may be a thin-film capacitor and may be formed in a mesa structure.

Since there are electrostrictive materials with no or little DC-tunability, the present disclosure can be extended to such materials as non-tunable capacitors that are required to operate under a certain bias. These applications can benefit from electrostrictive suppression too and their well-known ripples are currently tolerated but not desired.

This written description uses examples to disclose the invention, including the best mode, and also to enable a person skilled in the art to make and use the invention. It should be understood that the examples depicted in the Figures may not be drawn to scale. The patentable scope of the invention may include other examples that occur to those skilled in the art.

What is claimed is:

1. A mobile device for providing wireless communications, the mobile device comprising:
one or more electronic radio frequency components; and a multi-layer capacitor in communication with the one or more radio frequency components, wherein the multi-layer capacitor comprises:
 a first layer comprising a first tunable capacitor that is positively DC-biased;
 a second layer that is acoustically coupled to and positioned over the first layer, wherein the second layer comprises a second tunable capacitor that is negatively DC-biased, wherein the first and second tunable capacitors share a first common electrode;
 a third layer that is acoustically coupled to and positioned over the second layer, wherein the third layer comprises a third tunable capacitor that is positively DC-biased, wherein the second and third tunable capacitors share a second common electrode,
 wherein the first, second and third tunable capacitors are biased to generate destructive acoustic interference,
 wherein each dielectric of the first, second and third tunable capacitors has a resonance frequency within 5% of each other,
 wherein each of the first and second common electrodes have a resonance frequency within 5% of each other,
 wherein a total number of positively DC-biased dielectric layers of the multi-layer capacitor is not equal to a total number of negatively DC-biased dielectric layers of the multi-layer capacitor, and
 wherein a bottom electrode of the first tunable capacitor is unbiased.

2. The mobile device of claim 1, wherein the multi-layer capacitor is a thin-film capacitor having a mesa capacitor structure, wherein the resonance frequency of each of the first, second and third layers is a function of at least one of thickness, density or material, and wherein the multi-layer capacitor is operable at frequencies greater than 0.1 GHz.

3. The mobile device of claim 1, wherein each of the first, second and third layers has a thickness within 20% of each other, and wherein each of the first, second and third layers has a density within 5% of each other.

4. The mobile device of claim 3, wherein at least one of the first, second or third layers is of a different material from the other of the first, second and third layers.

5. The mobile device of claim 3, wherein at least one of the first, second or third layers has a different thickness and a different density from the other of the first, second and third layers.

6. The mobile device of claim 1, wherein the multi-layer capacitor further comprises two or more additional layers that each comprise an additional tunable capacitor, wherein all layers of the multi-layer capacitor are alternately DC-biased with positive and negative DC bias, and wherein a total number of tunable capacitors of the multi-layer capacitor is odd.

7. The mobile device of claim 1, wherein the first, second and third layers comprise a dielectric formed from a high-K pyrochlore or perovskite material.

8. The mobile device of claim 7, wherein the dielectric comprises barium strontium titanium oxide.

9. The mobile device of claim 1, wherein the bottom electrode of the first tunable capacitor is formed directly on an insulating layer having a surface roughness of less than or equal to 0.08 micrometers.

10. The mobile device of claim 1, wherein the multi-layer tunable capacitor has a substantially linear capacitance within a frequency range of 0.1 to 40 GHz.

11. The mobile device of claim 1, wherein the one or more electronic radio frequency components include a receiver and a power amplifier, and wherein the multi-layer capacitor is positioned in a matching network.

12. A mobile device for providing wireless communications, the mobile device comprising:
 one or more electronic radio frequency components; and
 a multi-layer capacitor in communication with the one or more radio frequency components, wherein the multi-layer capacitor comprises:
  a plurality of dielectric layers forming tunable capacitors that are positioned over each other and that are alternately DC-biased with positive and negative DC bias, wherein a total number of the tunable capacitors is odd, wherein pairs of the plurality of dielectric layers share a common electrode and are acoustically coupled, wherein the tunable capacitors are DC-biased to generate destructive acoustic interference, and wherein a bottom electrode of a bottom tunable capacitor of the tunable capacitors is unbiased.

13. The mobile device of claim 12, wherein the multi-layer tunable capacitor has a substantially linear capacitance within a frequency range of 0.1 to 40 GHz.

14. The mobile device of claim 12, wherein the bottom electrode of the bottom capacitor is formed directly on an insulating layer having a surface roughness of less than or equal to 0.08 micrometers.

15. The mobile device of claim 12, wherein the one or more electronic radio frequency components include a receiver and a power amplifier, and wherein the multi-layer capacitor is positioned in a matching network.

16. The mobile device of claim 12, wherein each of the plurality of dielectric layers has a resonance frequency within 5% of each other.

17. The mobile device of claim 12, wherein each of the common electrodes has a resonance frequency within 5% of each other.

18. The mobile device of claim 12, wherein the multi-layer capacitor has a Q factor of 20 or greater at an entire range of frequencies from 1.5 to 40 GHz.

19. A method comprising: providing wireless communications from a mobile device utilizing one or more electronic radio frequency components and a multi-layer capacitor; providing a positive DC bias to a first dielectric layer of the multi-layer capacitor that forms a first tunable capacitor; providing a negative DC bias to a second dielectric layer of the multi-layer capacitor, wherein the second dielectric layer forms a second tunable capacitor acoustically coupled to and positioned over the first tunable capacitor, wherein the first and second tunable capacitors share a first common electrode; and providing a positive DC bias to a third dielectric layer of the multi-layer capacitor, wherein the third dielectric layer forms a third tunable capacitor acoustically coupled to and positioned over the second tunable capacitor, wherein the second and third tunable capacitors share a second common electrode, wherein the providing of the positive and negative DC bias generates destructive acoustic interference between the first, second and third dielectric layers, wherein a total number of positively DC-biased dielectric layers of the multi-layer capacitor is not equal to a total number of negatively DC-biased dielectric layers of the multi-layer capacitor; and wherein a bottom electrode of the first tunable capacitor is unbiased.

20. The method of claim 19, comprising: limiting operation of the multi-layer capacitor to frequencies between 0.1 GHz to 40 GHz, wherein each dielectric of the first, second, and third tunable capacitors has a resonance frequency within 5% of each other, wherein each of the first and second common electrodes have a resonance frequency within 5% of each other, wherein a bottom electrode of the first tunable capacitor is formed directly on an insulating layer between a substrate and the bottom electrode, and wherein the insulating layer has a surface roughness of less than or equal to 0.08 micrometers.

* * * * *